(12) United States Patent
Yu

(10) Patent No.: US 6,210,197 B1
(45) Date of Patent: Apr. 3, 2001

(54) BGA SOCKET

(75) Inventor: Hung-Chi Yu, Hsi-Chih (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/443,183

(22) Filed: Nov. 19, 1999

(30) Foreign Application Priority Data

May 15, 1999 (TW) ................................. 88207774

(51) Int. Cl.$^7$ ................................. H01R 13/625
(52) U.S. Cl. ................................. 439/342
(58) Field of Search ................................. 439/342, 259–270

(56) References Cited

U.S. PATENT DOCUMENTS

| | | | |
|---|---|---|---|
| 4,420,205 | * 12/1983 | Kirkman | 439/342 |
| 4,538,870 | * 9/1985 | Thewlis | 439/342 |
| 5,649,836 | * 7/1997 | Kashiwagi | 439/342 |
| 5,658,160 | * 8/1997 | Kashiwagi | 439/342 |
| 5,707,247 | * 1/1998 | Konstad | 439/342 |
| 5,730,615 | * 3/1998 | Lai et al. | 439/342 |
| 5,855,489 | * 1/1999 | Walker | 439/342 |

\* cited by examiner

*Primary Examiner*—Gary F. Paumen
(74) *Attorney, Agent, or Firm*—Wei Te Chung

(57) ABSTRACT

A BGA socket comprises a base and a cover disposed above and slidably engaging with the base. The base includes a pair of fixing mechanisms each including a projection at one of a pair of opposite corners of the base, a stepped slider plate and a metal plate. Each projection defines a cutout, an elongate recess at an end of each cutout for receiving the metal plate and a pair of grooves proximate lateral surfaces of each cutout. The slider plate includes a center portion, a first tab laterally extending from an end of the center portion, and a second tab oppositely extending from the other end of the center portion. The first tab is received in the grooves. The center portion abuts against a corner edge of the cover.

1 Claim, 6 Drawing Sheets

US 6,210,197 B1

BGA SOCKET

BACKGROUND OF THE INVENTION

The present invention relates to a BGA (Ball Grid Array) socket, and especially to a BGA socket for reliably engaging with a CPU.

A BGA socket having a compact dimension is commonly used within a notebook computer. The BGA socket such as the one disclosed in U.S. Pat. No. 5,730,615 usually includes a base and a cover slidable above the base thereby actuating pins of a CPU inserted into the socket to engage with terminals of the base.

Referring to FIG. 1, a conventional BGA socket 1 includes a cover 11 and a base 10 arranged under the cover 11. The cover 11 is slidably coupled to the base 10. The cover 11 defines a plurality of apertures (not shown) in alignment with passageways (not shown) of the base 10 for receiving corresponding terminals (not shown) therein. A plurality of solder balls (not shown) is disposed proximate the terminals between the base 10 and a mother board (not shown). Processed by an infrared reflow soldering method, the solder balls become molten thereby connecting the terminals to the mother board. A recess 12 is defined in the base 10 proximate a lateral edge thereof. A hole 13 is defined through the cover 11 corresponding to the recess 12 of the base 10. A rod 120 is disposed to extend through the hole 13 and an end 14 of the rod 120 is received in the recess 12. Pins (not shown) of a CPU 2 are inserted through the aperture into the passageways. Initially, no spring engagement exists between the pins and the terminals. Thereafter, the rod 120 is pivoted in a counterclockwise direction with the end 14 as a pivot. The cover 11 is laterally pushed thereby actuating the pins of the CPU 2 to engage with the terminals of the BGA socket 1.

However, besides the concretionary solder sites, no other retention means exists between the base 10 and the mother board. The action of the rod 120 exerts stress in the base 11 thereby possibly deforming the base 11. In addition, such a stress acts on the solder sites thereby adversely affecting quality of electrical connection between the BGA socket 1 and the mother board.

SUMMARY OF THE INVENTION

Accordingly, the primary object of the present invention is to provide a BGA socket having a reliable structure which can be repeatedly used.

Another object of the present invention is to provide a BGA socket having a cover which can be smoothly actuated to push pins of a CPU to reliably engage with terminals of the BGA socket.

To fulfill the above-mentioned objects, a BGA socket in accordance with the present invention comprises a base defining a plurality of passageways and a cover defining a plurality of openings in alignment with the passageways. Pins of a CPU are inserted through the openings and into the passageways for engaging corresponding terminals in the passageways. The cover is disposed above and slidably engages with the base. The base includes a pair of fixing mechanisms each including a projection, i.e. an operation section, at one of a pair of opposite corners of the base, a stepped slider plate and a metal plate. Each projection defines a cutout. An elongate recess is defined at an end of each cutout for receiving the metal plate. A pair of grooves is formed proximate lateral surfaces of each cutout. The slider plate includes a center portion, a first tab laterally extending from an end of the center portion and a second tab oppositely extending from the other end of the center portion. The first tab is received in the grooves. The center portion abuts against a corner edge of the cover edge. The second tab abuts against a top surface of the cover proximate the corner. A pair of lateral surfaces of the cutout, the metal plate and the slider plate cooperatively define an actuation space. When the pins of the CPU are inserted into the passageways, there is no spring engagement between the pins and the terminals. A screwdriver is inserted into the space and is rotated to inwardly press against the slider plate thereby pushing the cover to slide above the base. Thus, the pins of the CPU are pushed to engage with the terminals of the socket. Since the second tab of the slider plate downwardly abuts against the cover, the cover is not upwardly deformed Other objects, advantages and novel features of the invention will become more apparent from the following detailed description when taken in conjunction with the accompanying drawings.

DETAILED DESCRIPTION OF A PREFERRED EMBODIMENT

Figure 1:
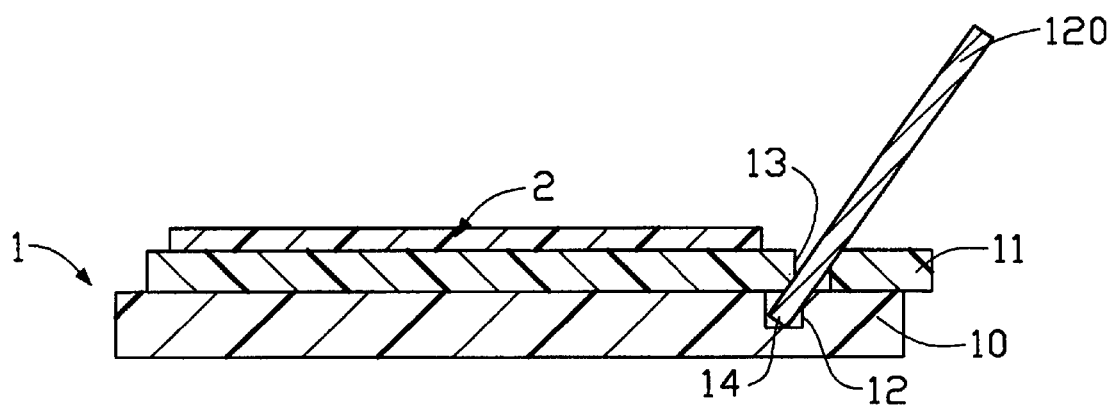
FIG. 1 is a cross-sectional view of a conventional BGA socket and a CPU.
Figure 2:
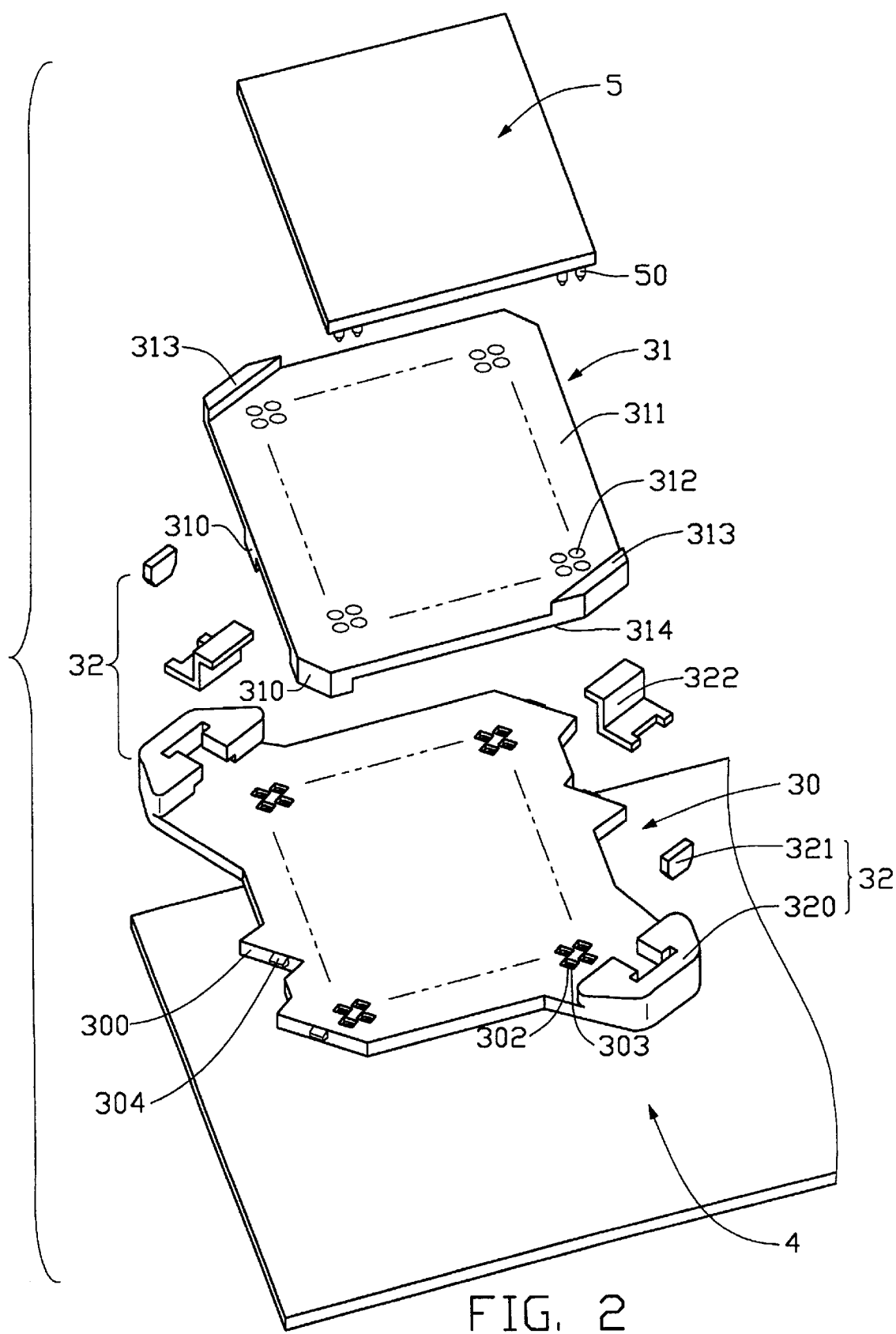
FIG. 2 is an exploded view of a BGA socket in accordance with the present invention, a CPU and a mother board.

Referring to FIG. 2, a BGA socket 3 (FIG. 4) in accordance with the present invention is mounted to a mother board 4 for being connected to a CPU 5. The BGA socket 3 comprises a base 30 and a cover 31 arranged above the base 30.

The cover 31 is substantially square and defines a plurality of openings 312 through a top surface 311 and a bottom surface 314 thereof. A standing portion 313 is formed on the top surface 311 proximate one of a pair of opposite corners of the cover 31. A plurality of standoffs 310 is formed proximate opposite edges of the cover 31. Each standoff 310 defines a slit (not shown).

The base 30 defines a plurality of passageways 302 therethrough in alignment with the openings 312 of the cover 31 for receiving corresponding terminals 303 therein. A plurality of triangular plates 300 outwardly extends from opposite edges of the base 30 corresponding to the standoffs 310 of the cover 31. Each triangular plate 300 has an engaging face 300. An inclined projection 304 projects from the engaging face 300 for being slidably received in the slit of the corresponding standoff 300.

Figure 3:
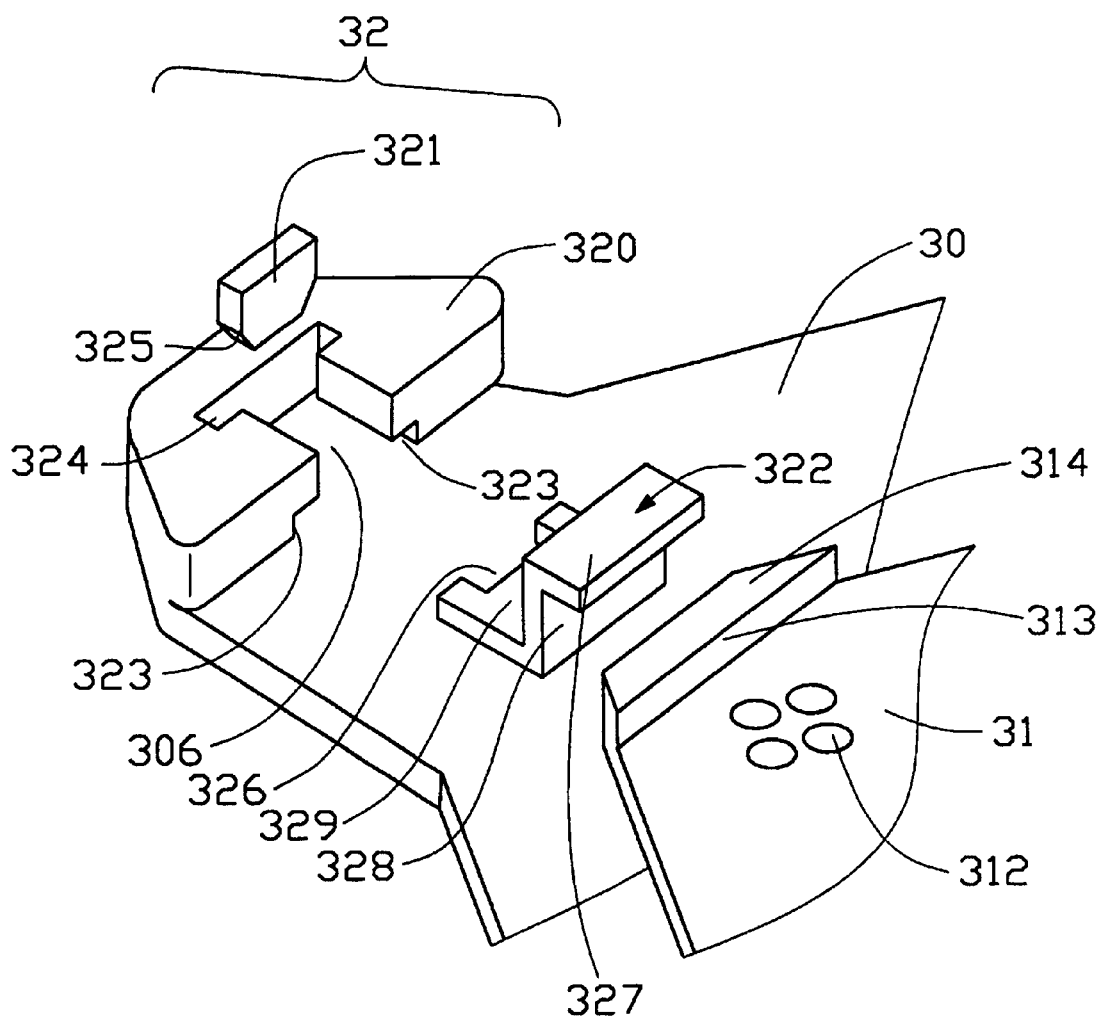
FIG. 3 is a partial, enlarged view of the BGA of the present invention.
Figure 4:
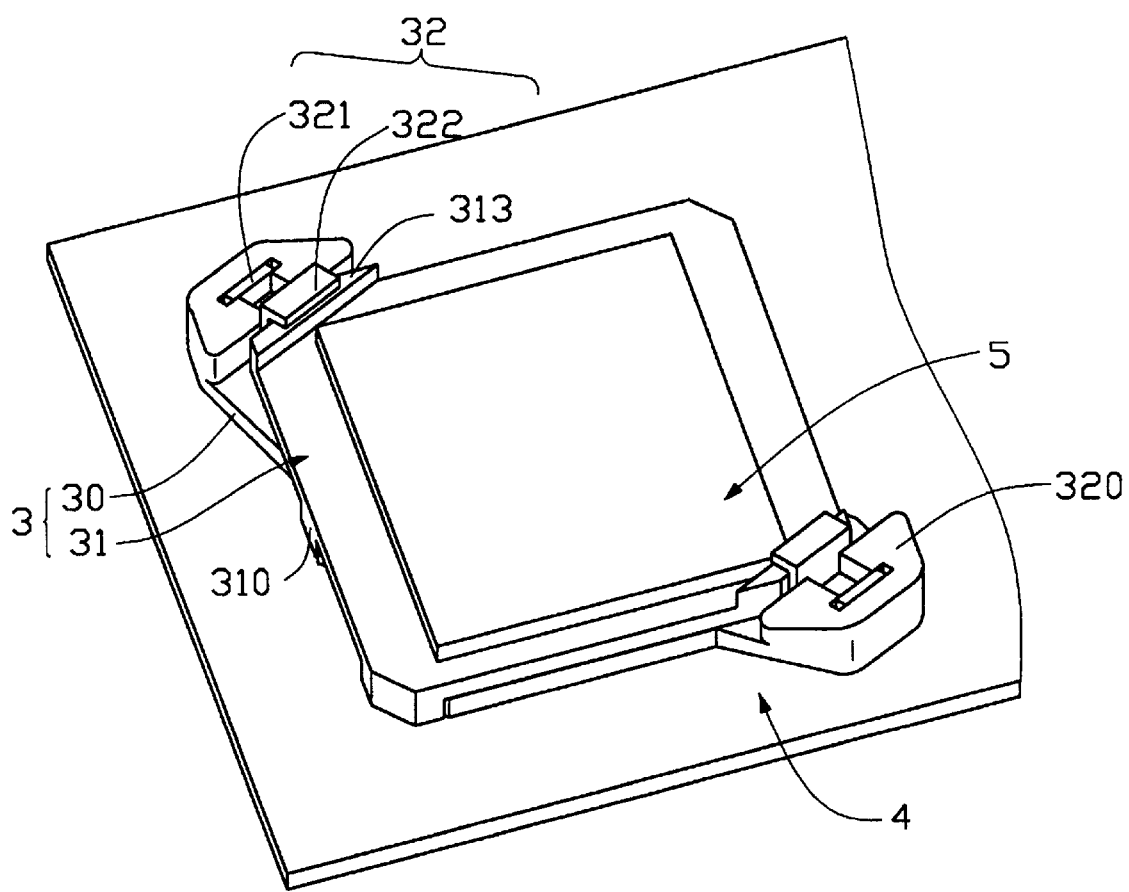
FIG. 4 is an assembled view of FIG. 2.
Figure 5:
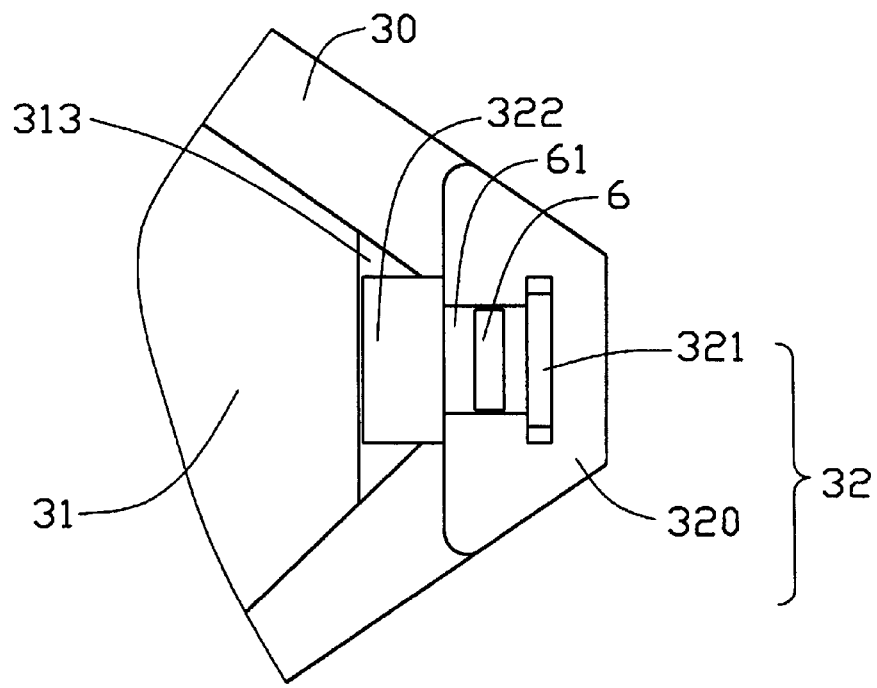
FIG. 5 is partial top plan view of the BGA socket of the present invention and a screwdriver.
Figure 6:
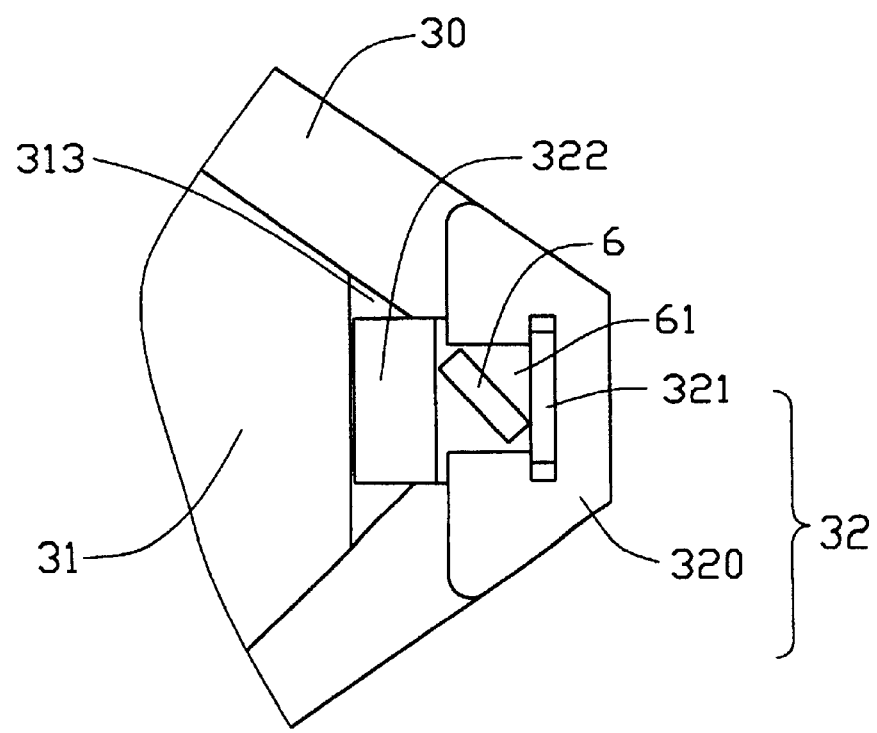
FIGS. 6 and 7 are sequential views similar to FIG. 5 showing the screwdriver being rotated to laterally push a cover of the BGA socket of the present invention relative to a base.
Figure 7:
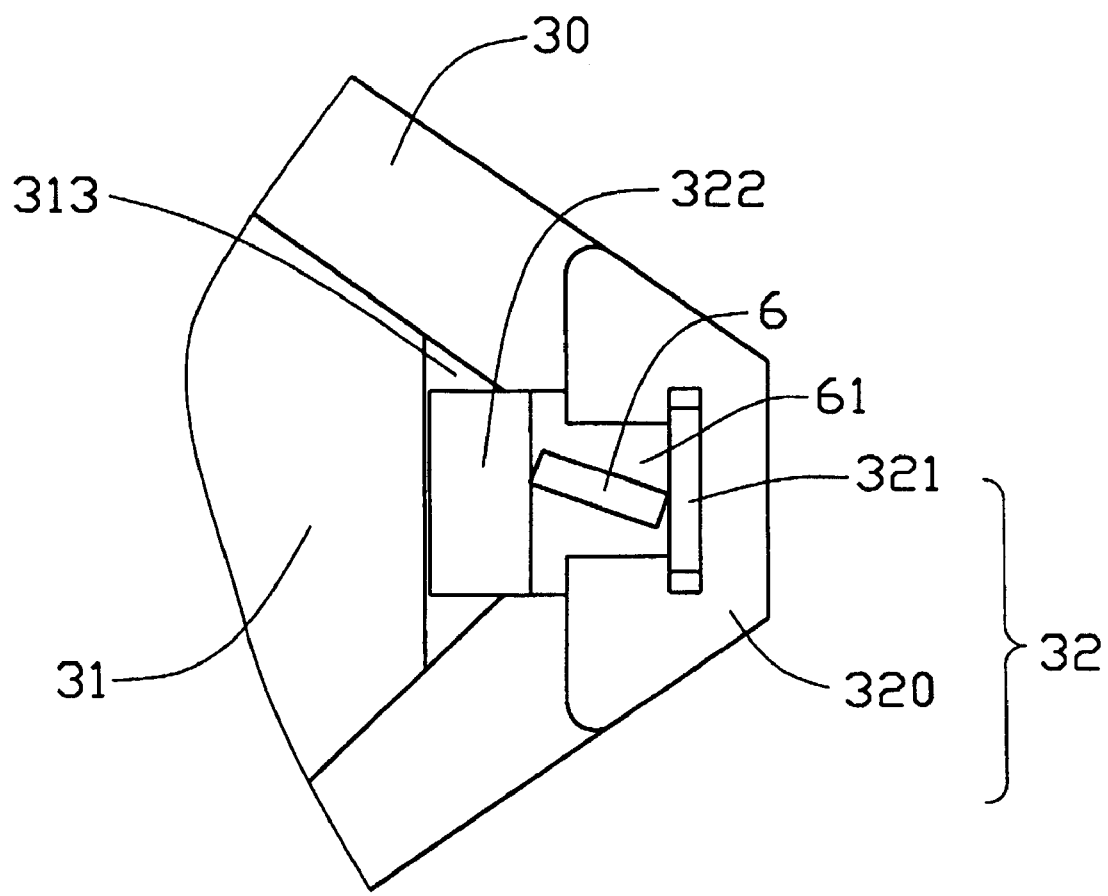

Also referring to FIG. 3, a pair of fixing mechanisms 32 is used to attach the cover 31 to the base 30. Each fixing mechanisms 32 includes a projection 320 on a top surface of the base 30 proximate one of a pair of opposite corners thereof, a stepped slider plate 322 and a metal plate 321. Each projection 320 defines a cutout 306. The two cutouts 306 face each other. An elongate recess 324 is defined in the projection 320 in communication with the cutout 306 for receiving the metal plate 321. The metal plate 321 has a pair of inclined surfaces 325. The cutout 306 and the recess 324 are cooperatively T-shaped. A pair of grooves 323 is formed in the projection 320 below and beside the cutout 306. The slider plate 322 includes a center portion 328, a first tab 329 laterally extending from an end of the center portion 328 and a second tab 329 oppositely extending from the other end of the vertical center portion 328. The first tab 329 defines an engaging cutout 326. The first tab 329 is received in the grooves 323 with the engaging cutout 326 engaging with the inclined surfaces 325 of the metal plate 321. The center portion 328 abuts against a corner of the cover 31. When the cover 31 and the base 30 are assembled together as shown in FIG. 4, the second tab 327 abuts against a top surface 314 of the standing portion 313 of the cover 31.

Referring to FIGS. 2 and 5–7, a pair of surfaces (not labeled) defined by the projection 320 beside the cutout 306, the metal plate 321 and the slider plate 322 cooperatively define an actuation space 61. When the pins 50 of the CPU 5 are inserted through the openings 312 of the cover 31 and into the passageways 302 of the base 30, a spring engagement does not exist between the pins 50 and the terminals 303. A screwdriver 6 is inserted into the actuation space 61 and is rotated to laterally press against the slider plate 322 thereby smoothly pushing the cover 31 to slide on the base 30. Thus, the pins 50 of the CPU 5 are pushed to engage with the terminals 303 of the socket 3. A plurality of solder balls (not shown) is disposed proximate the corresponding terminals 303 between the BGA socket 3 and the mother board 4. Processed by an infrared reflow soldering method, the solder balls become molten thereby connecting the terminals 303 to the mother board 4. Since the second tab 327 of the slider plate 322 downwardly abuts against the cover 31, the cover 31 is not upwardly deformed thereby preventing the solder sites from becoming damaged.

In addition, the cover 31 is smoothly pushed by the screwdriver 6 to slide on the base 30 thereby promoting reliable engagement between the terminals 303 of the BGA socket 3 on the mother board 4 and the pins 50 of the CPU 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket for connecting a CPU and a mother board, comprising:

a base having a top surface and a bottom surface opposite the top surface, the base defining a plurality of passageways between the top and bottom surfaces and having a first corner, a projection being formed on the top surface proximate the first corner edge, a cutout being defined in the projection;

a plurality of terminals received in the passageways and soldered to the mother board;

an insulative cover slidably attached to the top surface of the base, the cover defining a plurality of openings aligned with the passageways and having a second corner; and a slider plate downwardly pressing against the second corner and abutting against the projection in a first position, a distance defined by an inner end of the cutout and the slider for allowing a tool inserted thereinto to actuate the slider from the first position to a second position wherein the slider is spaced apart from the projection;

further including a metal plate, and wherein an elongate recess is defined in the projection and in communication with the cutout, the metal plate being received in the recess for providing a fulcrum for the actuation of the tool;

wherein the slider plate includes a first tab laterally extending from a lower end thereof, and wherein a groove is defined in the projection for slidably receiving the firs tab;

wherein the slider plate includes a second tab laterally extending from an upper end of the center portion opposite the lower end for downwardly pressing against the corner edge of the cover;

wherein the cover forms a standing portion on a third upper surface thereof for being pressed by the second tab of the slider plate.

* * * * *